United States Patent
Wang et al.

(10) Patent No.: US 11,456,515 B2
(45) Date of Patent: Sep. 27, 2022

(54) RECONFIGURABLE WIDEBAND HIGH-FREQUENCY FILTER USING NON-RECIPROCAL CIRCULATOR

(71) Applicant: Raytheon Company, Waltham, MA (US)

(72) Inventors: Zhaoyang C. Wang, Carlisle, MA (US); Ajay Subramanian, Nashua, NH (US); Jason C. Soric, North Andover, MA (US); Matthew A. Morton, Lynnfield, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/307,261

(22) Filed: May 4, 2021

(65) Prior Publication Data
US 2021/0384599 A1 Dec. 9, 2021

Related U.S. Application Data

(60) Provisional application No. 63/034,617, filed on Jun. 4, 2020.

(51) Int. Cl.
*H01P 1/38* (2006.01)
*H03H 11/04* (2006.01)
*H01P 1/18* (2006.01)

(52) U.S. Cl.
CPC .............. *H01P 1/38* (2013.01); *H01P 1/18* (2013.01); *H03H 11/04* (2013.01); *H03H 2011/0488* (2013.01)

(58) Field of Classification Search
CPC .. H01P 1/38; H01P 1/18; H03H 11/04; H03H 2011/0488
See application file for complete search history.

(56) References Cited

U.S. PATENT DOCUMENTS

| 6,226,425 B1 * | 5/2001 | Chang-Hasnain .... H04J 14/021 385/24 |
| 9,536,512 B2 | 1/2017 | Alu et al. |

(Continued)

FOREIGN PATENT DOCUMENTS

| JP | H0275801 U | 6/1990 |
| JP | 2005268898 A | 9/2005 |

(Continued)

OTHER PUBLICATIONS

Nagulu et al., "Ultra Compact, Ultra Wideband, DC-1GHz CMOS Circulator Based on Quasi-Electrostatic Wave Propagation in Commutated Switched Capacitor Networks", 2020 IEEE Radio Frequency Integrated Circuits Symposium, 2020, 4 pages.

(Continued)

*Primary Examiner* — Dinh T Le

(57) ABSTRACT

A method includes receiving a radio frequency (RF) input signal using at least one non-reciprocal circulator. The method also includes generating an RF output signal using at least one of multiple reflective filter elements. Each reflective filter element is configured to receive an RF signal from the at least one non-reciprocal circulator and to provide a filtered RF signal to the at least one non-reciprocal circulator. The reflective filter elements include amplitude change reflectors configured to modify amplitudes of the RF signal at different frequencies. The RF output signal represents the RF input signal as modified by the at least one of the reflective filter elements.

20 Claims, 4 Drawing Sheets

(56) References Cited

U.S. PATENT DOCUMENTS

| | | | |
|---|---|---|---|
| 9,887,862 | B2 | 2/2018 | Zhou et al. |
| 10,581,135 | B2 | 3/2020 | Reiskarimian et al. |
| 10,673,407 | B2 | 6/2020 | Rinaldi et al. |
| 2011/0174078 | A1* | 7/2011 | Chinn .................... G01H 9/004 73/657 |
| 2012/0299789 | A1 | 11/2012 | Orban et al. |
| 2013/0321091 | A1* | 12/2013 | Nishida .................... H01P 1/387 333/1.1 |
| 2017/0212367 | A1 | 7/2017 | Alu et al. |
| 2019/0305397 | A1 | 10/2019 | Dinc et al. |
| 2019/0372190 | A1 | 12/2019 | Kord et al. |
| 2020/0412519 | A1 | 12/2020 | Krishnaswamy et al. |

FOREIGN PATENT DOCUMENTS

| | | | |
|---|---|---|---|
| JP | 2008002947 | A | 1/2008 |
| WO | 2016/047218 | A1 | 3/2016 |
| WO | 2020036669 | A2 | 2/2020 |
| WO | 2020150745 | A1 | 7/2020 |

OTHER PUBLICATIONS

Reiskarimian et al., "Magnetic-free non-reciprocity based on staggered commutation", Nature Communications, Apr. 2016, 10 pages.

Subramanian et al., U.S. Appl. No. 17/307,237 titled "Reconfigurable Wideband High-Frequency Circuits Using Non-Reciprocal Circulators" filed May 4, 2021, 40 pages.

Fettweis, "Some Properties of Pulse Impedances and Pulse Impedance Matrices", Nov. 1970, 8 pages.

Bruckmann, "Circulator Reference Structures for Switched Capacitor and Digital Filter Design", AEU Int. J. Electron Commun., vol. 51, No. 5, Sep. 1997, 8 pages.

Peregrine Semiconductor, "Product Specification PE64102", Jan. 2012, 14 pages.

Fettweis, "Realization of General Network Functions Using the Resonant-transfer Principle", Jun. 1971, 10 pages.

International Search Report dated Aug. 25, 2021 in connection with International Patent Application No. PCT/US2021/030974, 4 pages.

Written Opinion of the International Searching Authority dated Aug. 25, 2021 in connection with International Patent Application No. PCT/US2021/030974, 8 pages.

International Search Report and Written Opinion of the International Searching Authority dated Aug. 31, 2021 in connection with International Patent Application No. PCT/US2021/030977, 57 pages.

* cited by examiner

RECONFIGURABLE WIDEBAND HIGH-FREQUENCY FILTER USING NON-RECIPROCAL CIRCULATOR

CROSS-REFERENCE TO RELATED APPLICATION AND PRIORITY CLAIM

This application claims priority under 35 U.S.C. § 119(e) to U.S. Provisional Patent Application No. 63/034,617 filed on Jun. 4, 2020.

GOVERNMENT LICENSE RIGHTS

This invention was made with government support under FA8650-21-C-70008 P00001 awarded by the United States Air Force. The government has certain rights in the invention.

TECHNICAL FIELD

This disclosure relates generally to communication systems. More specifically, this disclosure relates to a reconfigurable wideband high-frequency filter using a non-reciprocal circulator.

BACKGROUND

Wireless communication systems have become ubiquitous in today's society. In some cases, a wireless communication system needs to have the ability to operate effectively over a wide range of operating frequencies. For example, various microwave communication systems may use frequencies in the range of 300 MHz to 300 GHz, and any individual microwave communication system may need to use frequencies within a wide subset of that frequency range.

SUMMARY

This disclosure relates to a reconfigurable wideband high-frequency filter using a non-reciprocal circulator.

In a first embodiment, a system includes at least one non-reciprocal circulator and multiple reflective filter elements. Each reflective filter element is configured to receive a radio frequency (RF) signal from the at least one non-reciprocal circulator and to provide a filtered RF signal to the at least one non-reciprocal circulator. The reflective filter elements include amplitude change reflectors configured to modify amplitudes of the RF signal at different frequencies.

In a second embodiment, a method includes receiving an RF input signal using at least one non-reciprocal circulator. The method also includes generating an RF output signal using at least one of multiple reflective filter elements. Each reflective filter element is configured to receive an RF signal from the at least one non-reciprocal circulator and to provide a filtered RF signal to the at least one non-reciprocal circulator. The reflective filter elements include amplitude change reflectors configured to modify amplitudes of the RF signal at different frequencies. The RF output signal represents the RF input signal as modified by the at least one of the reflective filter elements.

In a third embodiment, a non-transitory computer readable medium contains instructions that when executed cause at least one controller to reconfigure a system having at least one non-reciprocal circulator and multiple reflective filter elements. Each reflective filter element is configured to receive an RF signal from the at least one non-reciprocal circulator and to provide a filtered RF signal to the at least one non-reciprocal circulator. The reflective filter elements include amplitude change reflectors configured to modify amplitudes of the RF signal at different frequencies. The instructions that cause the at least one controller to reconfigure the system include instructions that cause the at least one controller to change a sequence of non-overlapping pulses in control signals provided to multiple switches of each non-reciprocal circulator in order to selectively control which of the reflective filter elements is conductively coupled to the at least one non-reciprocal circulator.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
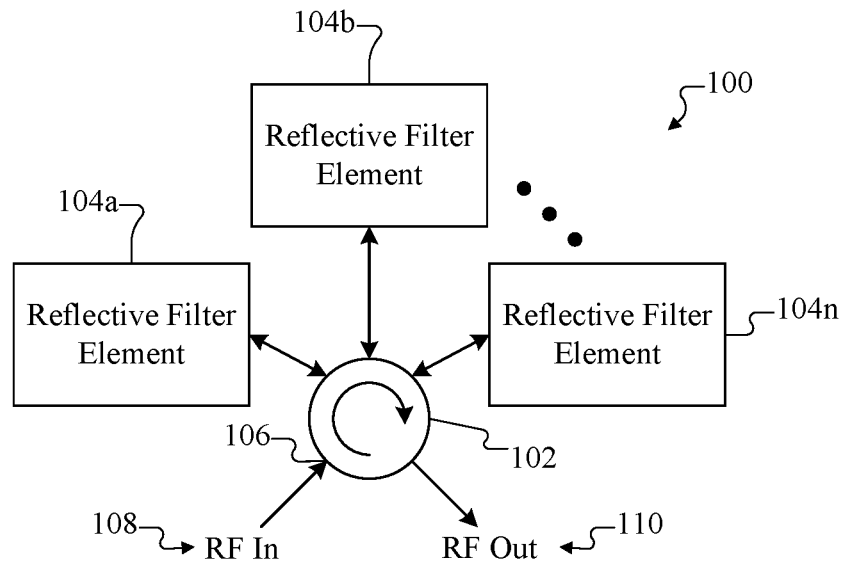
FIG. 1 illustrates an example non-reciprocal circulator-based filtering circuit supporting wideband reconfigurable high-frequency filtering according to this disclosure.

FIGS. 1 through 5, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, wireless communication systems have become ubiquitous in today's society. In some cases, a wireless communication system needs to have the ability to operate effectively over a wide range of operating frequencies. For example, various microwave communication systems may use frequencies in the range of 300 MHz to 300 GHz, and any individual microwave communication system may need to use frequencies within a wide subset of that frequency range. As a particular example, a microwave communication system may need to be reconfigurable to operate or sweep over a frequency range of about 2 GHz to about 18 GHz. Often times, this requires that the communication system include different filters that can be used at different times to handle different frequencies.

This disclosure provides various non-reciprocal circulator-based filters that can be used to provide reconfigurable wideband high-frequency filtering. These circulator-based filters can be used in microwave frontends or other larger systems. As described in more detail below, each of the circulator-based filters generally includes at least one non-reciprocal circulator and multiple reflective filter elements (such as reflective band-pass or band-stop filters) coupled to the non-reciprocal circulator(s).

A non-reciprocal circulator can receive a radio frequency (RF) input signal and provide the RF input signal to a first reflective filter element, which can reflect the RF input signal as a filtered RF signal back to the non-reciprocal circulator. If desired, the filtered RF signal can be provided to a second reflective filter element, which can reflect the filtered RF signal as a twice-filtered RF signal back to the non-reciprocal circulator. The non-reciprocal circulator can provide an RF output signal having one or more desired characteristics based on the filtering provided by the reflective filter element(s). The reflective filter element or elements used to filter the RF input signal can vary as needed or desired, and different reflective filter elements can be used over time to filter the RF input signal in different ways over time.

Depending on the implementation, the circulator-based filters here can be highly reconfigurable and highly linear, such as through the use of gallium nitride (GaN) implementations. Also, in some cases, at least some of the reflective filter elements can be selectively connected to and disconnected from the non-reciprocal circulator in order to provide desired functionality. In this way, the circulator-based filters can be used to implement reconfigurable wideband high-frequency filtering functions as needed or desired in a wireless communication system or other system.

These circulator-based filters may be used in any number of applications to support high-power or other wireless communications or other functionality. For example, the circulator-based filters may be used in so-called "5G" base stations or other high-power base stations. As other examples, these circulator-based filters may be used to replace a variety of RF frontends in various devices or implemented as transmit/receive module integrated circuits. Note, however, that the circulator-based filters may be used in any other suitable manner.

FIG. 1 illustrates an example non-reciprocal circulator-based filtering circuit 100 supporting wideband reconfigurable high-frequency filtering according to this disclosure. As shown in FIG. 1, the circuit 100 generally includes at least one non-reciprocal circulator 102 and multiple reflective filter elements 104a-104n coupled to the non-reciprocal circulator(s) 102. Depending on the implementation, the circuit 100 may include a single non-reciprocal circulator 102 or multiple non-reciprocal circulators 102. Also, any suitable number(s) and type(s) of reflective filter elements 104a-104n may be coupled to each non-reciprocal circulator 102. In addition, if multiple non-reciprocal circulators 102 are present, the number(s) and type(s) of reflective filter elements 104a-104n coupled to the non-reciprocal circulators 102 may be the same or different.

Each non-reciprocal circulator 102 includes multiple input/output (I/O) ports 106, where each I/O port is configured to receive an RF signal and/or provide an RF signal. Each non-reciprocal circulator 102 is also configured to allow an RF signal received at one port 106 to travel in one direction (clockwise in this particular example) and be output through the next enabled or active port. In this example, the non-reciprocal circulator 102 receives an RF input signal 108 at a first port 106, and the RF input signal 108 may be output through a second port to the first reflective filter element 104a. The non-reciprocal circulator 102 may also receive an input signal at the second port 106 (which represents a modified version of the signal previously output through the second port 106), and the input signal may be output through a third port to the second reflective filter element 104b. A final port 106 provides an RF output signal 110. Note here that one, some, or all of the reflective filter elements 104a-104n may be used to convert the RF input signal 108 into the RF output signal 110.

The non-reciprocal circulator 102 includes any suitable structure configured to allow RF signals to circulate between different inputs and outputs in a non-reciprocal manner. The phrase "non-reciprocal" indicates that forward and reverse signals (meaning incoming and outgoing signals) at the same port traverse different paths, which helps to permit movement of the signals in a clockwise or counter-clockwise direction (but not both). In some embodiments, the non-reciprocal circulator 102 represents a field effect transistor (FET) or other transistor-based non-reciprocal circulator. One example implementation of the non-reciprocal circulator 102 is described in Nagulu et al., "Ultra Compact, Ultra Wideband, DC-1 GHz CMOS Circulator Based on Quasi-Electrostatic Wave Propagation in Commutated Switched Capacitor Networks," 2020 IEEE Radio Frequency Integrated Circuits Symposium, August 2020, pages 55-58 (which is hereby incorporated by reference in its entirety).

Each of the reflective filter elements 104a-104n is configured to filter the RF signal traversing through the non-reciprocal circulator 102 and to provide the filtered signal back to the non-reciprocal circulator 102. The exact makeup and functionality of the reflective filter elements 104a-104n can vary depending on the implementation. For example, in some cases, the RF input signal 108 passes through all of the reflective filter elements 104a-104n sequentially in order to achieve a desired frequency response and produce a desired RF output signal 110. In other cases, the RF input signal 108 passes through one or some (but not all) of the reflective filter elements 104a-104n sequentially in order to achieve a desired frequency response and produce a desired RF output signal 110, and the reflective filter elements 104a-104n that are used to filter the RF input signal 108 can be controlled (such as based on the frequency of the RF input signal 108 or the RF output signal 110 and/or the desired frequency response). As a particular example, transistor switches or other devices may be used to selectively block or allow passage of an RF signal between the non-reciprocal circulator 102 and each of the reflective filter elements 104a-104n. Each of the reflective filter elements 104a-104n may be said to represent a different "branch" of the circuit 100.

Each of the reflective filter elements 104a-104n includes any suitable structure configured to filter an RF signal from the non-reciprocal circulator 102 and to provide the filtered RF signal back to the non-reciprocal circulator 102. Example implementations of the reflective filter elements 104a-104n are provided below, where the reflective filter elements 104a-104n are used to implement circuits in a wideband high-frequency filter system. However, the reflective filter elements 104a-104n may be used to provide any other desired filtering functionality.

Although FIG. 1 illustrates one example of a non-reciprocal circulator-based filtering circuit 100 supporting wideband reconfigurable high-frequency filtering, various changes may be made to FIG. 1. For example, each non-reciprocal circulator 102 may have any suitable number of ports 106 and be coupled to any suitable number of reflective filter elements 104a-104n. Also, various components in FIG. 1 may be combined, further subdivided, replicated, omitted, or rearranged and additional components may be added according to particular needs.

Figure 2:
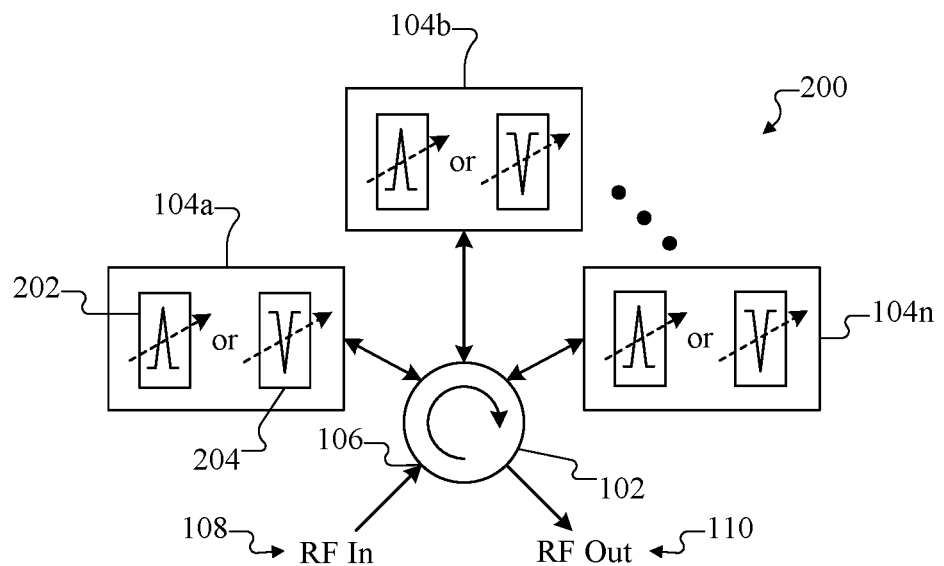
FIG. 2 illustrates a more specific example non-reciprocal circulator-based filtering circuit supporting wideband reconfigurable high-frequency filtering according to this disclosure.

FIG. 2 illustrates a more specific example non-reciprocal circulator-based filtering circuit 200 supporting wideband reconfigurable high-frequency filtering according to this disclosure. As shown in FIG. 2, the circuit 200 includes the non-reciprocal circulator 102 and the reflective filter elements 104a-104n. Here, each of the reflective filter elements 104a-104n includes one of a band-pass filter 202 or a band-stop filter 204 (or possibly both, such as when each is controlled by an input switch). Each filter 202 or 204 generally operates to reflect some frequencies while blocking other frequencies. More specifically, the band-pass filter 202 generally reflects frequencies falling within a specified range (a pass band) and blocks other frequencies, while the band-stop filter 204 generally reflects all frequencies except those falling within a specified range (a block band). Essentially, the reflective filter elements 104a-104n here are functioning as "amplitude change" reflectors since they are changing the amplitudes of the blocked frequencies (generally down to zero).

The reflective filter elements 104a-104n here can include different band-pass filters 202 and/or different band-stop filters 204, such as filters 202 and/or 204 with different frequency responses. Depending on the implementation, the reflective filter elements 104a-104n may all include band-pass filters 202 or all include band-stop filters 204, or a combination of band-pass filters 202 and band-stop filters 204 may be used in the reflective filter elements 104a-104n. Note, however, that this disclosure is not limited to the use of band-pass and band-stop filters and that other or additional types of filters may be used in the circuit 200, such as one or more low-pass filters and/or one or more high-pass filters.

Using this circuit 200, a desired complex frequency response can be obtained to meet particular needs of a frontend system or other system. For example, transistor switches or other devices may be used to allow the RF input signal 108 to pass through one or more of the filters 202, 204 in one or more of the reflective filter elements 104a-104n in order to generate the RF output signal 110. The particular filter(s) 202, 204 and reflective filter element(s) 104a-104n used at any given time can vary based on the desired frequency response. In other words, the RF input signal 108 can be controllably passed through one or more selected branches of the circuit 200 in order to obtain the desired frequency response. As a result, the circuit 200 can be used to create a wideband reconfigurable filtering system that is able to operate over a wide range of operating frequencies.

Although FIG. 2 illustrates one more specific example of a non-reciprocal circulator-based filtering circuit 200 supporting wideband reconfigurable high-frequency filtering, various changes may be made to FIG. 2. For example, the non-reciprocal circulator 102 may have any suitable number of ports 106 and be coupled to any suitable number of reflective filter elements 104a-104n, and each reflective filter element 104a-104n may include any suitable number(s) and type(s) of filter(s). Also, it is possible for some of the reflective filter element 104a-104n to include non-filter-related components or to perform non-filter-related functions. In addition, various components in FIG. 2 may be combined, further subdivided, replicated, omitted, or rearranged and additional components may be added according to particular needs.

Figure 3A:
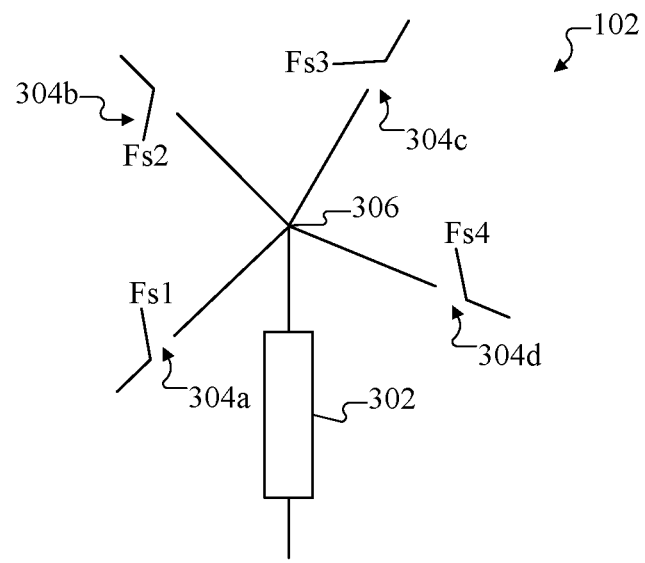
FIGS. 3A and 3B illustrate an example non-reciprocal circulator and its operation according to this disclosure.
Figure 3B:
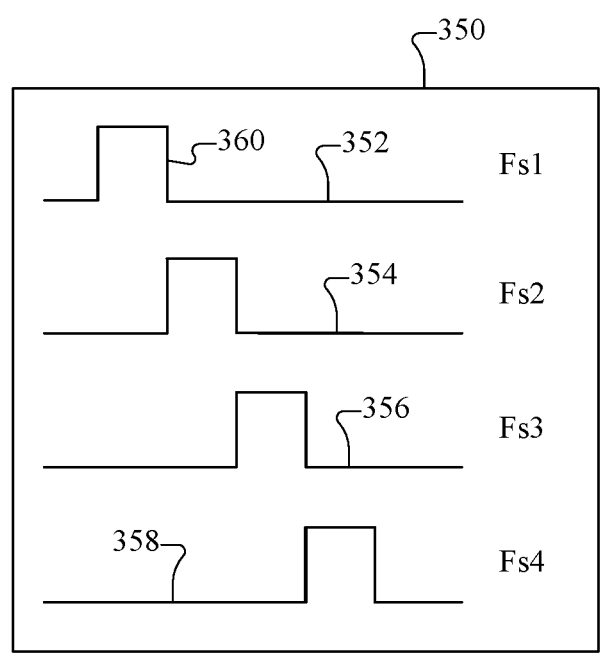

FIGS. 3A and 3B illustrate an example non-reciprocal circulator 102 and its operation according to this disclosure. As shown in FIG. 3A, the non-reciprocal circulator 102 includes at least one energy storage device 302 and multiple switches 304a-304d coupled to a common node 306. The energy storage device 302 includes any suitable structure configured to store and release electromagnetic energy, such as one or more capacitors or inductors (like one or more high-Q capacitors or inductors). Each switch 304a-304d is configured to be closed (become conductive) and opened (become non-conductive) in order to selectively allow passage of an RF signal through the switch. For example, the switch 304a may be closed to provide the RF input signal 108 to the common node 306. One or more of the switches 304b-304c may be closed to provide an RF signal from the common node 306 to one or more reflective filter elements 104a-104n. The switch 304d may be closed to provide the RF output signal 110 from the common node 306. Each switch 304a-304d includes any suitable structure configured to selectively form and block an electrical connection, such as a FET or other transistor.

Note that while the non-reciprocal circulator 102 here includes four switches 304a-304d, this is for illustration only. The non-reciprocal circulator 102 may include less than four or more than four switches 304a-304d depending on the implementation. For instance, the non-reciprocal circulator 102 may include one switch for receiving the RF input signal 108, one switch for providing the RF output signal 110, and one switch for each reflective filter element 104a-104n coupled to the non-reciprocal circulator 102.

As shown in FIG. 3B, a timing diagram 350 illustrates example operation of the switches 304a-304d of the non-reciprocal circulator 102. Here, the timing diagram 350 includes a line 352 representing a control signal Fs1 for the switch 304a, a line 354 representing a control signal Fs2 for the switch 304b, a line 356 representing a control signal Fs3 for the switch 304c, and a line 358 representing a control signal Fs4 for the switch 304d. Each control signal includes pulses 360 that define when the associated switches 304a-304d are conductive.

As can be seen here, the pulses 360 in the control signals occur sequentially. In other words, the pulses 360 in the different control signals are not overlapping with one another, so only one of the switches 304a-304d is conductive at any given time. The sequential use of the pulses 360 in the control signals allows for the transport of the RF signals through the non-reciprocal circulator 102 in a circular manner. In some embodiments, the pulses 360 occur in this sequential manner during a repeating time interval, where the period of the interval is denoted Ts. Here, each pulse 360 may have a duration defined as Ts/N, where N represents the number of switches 304a-304d that are actively being used to pass the RF input signal 108 to the desired reflective filter element(s) 104a-104n and to output the RF output signal 110. Also, the energy storage device 302 here may create a reflection at a frequency of N×Fs, where Fs denotes the frequency of the RF input signal 108.

It should be noted that it is possible to reconfigure the circulation of RF signals through the non-reciprocal circulator 102 by changing the sequence of the sequential pulses 360 in the control signals. As a result, the branch or branches of a circuit to and from the non-reciprocal circulator 102 that are followed by an RF signal during processing can be changed by adjusting the sequence of the sequential pulses 360 in the control signals. The sequence of the sequential pulses 360 in the control signals may be controlled in any suitable manner, such as by using a processor or other control device.

The non-reciprocal circulator 102 may be implemented in any suitable manner using any suitable materials. For example, in some embodiments, a ferrite-based non-reciprocal circulator 102 may be implemented using single-junction or multi junction approaches, using self biased hexaferrite, or using a lumped element. In other embodiments, an electronic-based non-reciprocal circulator 102 may be implemented using spatio-temporal modulation, be switch-based, or be implemented using sequentially-switched delay lines. An electronic-based non-reciprocal circulator 102 may support N-way or N-path designs and represent a quasi-circulator or an active circulator. An electronic-based non-reciprocal circulator 102 may support linear time-varying operation or operate as an active or passive mixer. Still other embodiments of the non-reciprocal circulator 102 may be based on bulk acoustic wave devices, spin wave/topological insulators, or Josephson junctions. In addition, embodiments of the non-reciprocal circulator 102 may be single-ended or differential.

Although FIGS. 3A and 3B illustrate one example of a non-reciprocal circulator 102 and its operation, various changes may be made to FIGS. 3A and 3B. For example, the number of switches 304a-304d and associated control signals can vary as needed or desired. As a particular example, if an RF input signal 108 passes through one or some (but not all) of the reflective filter elements 104a-104n, control signals for the used reflective filter elements 104a-104n may include sequential pulses, and control signals for the unused reflective filter elements 104a-104n would include no pulses. Also, any other suitable non-reciprocal circulator may be used in the circuits described in this patent document.

Figure 4:
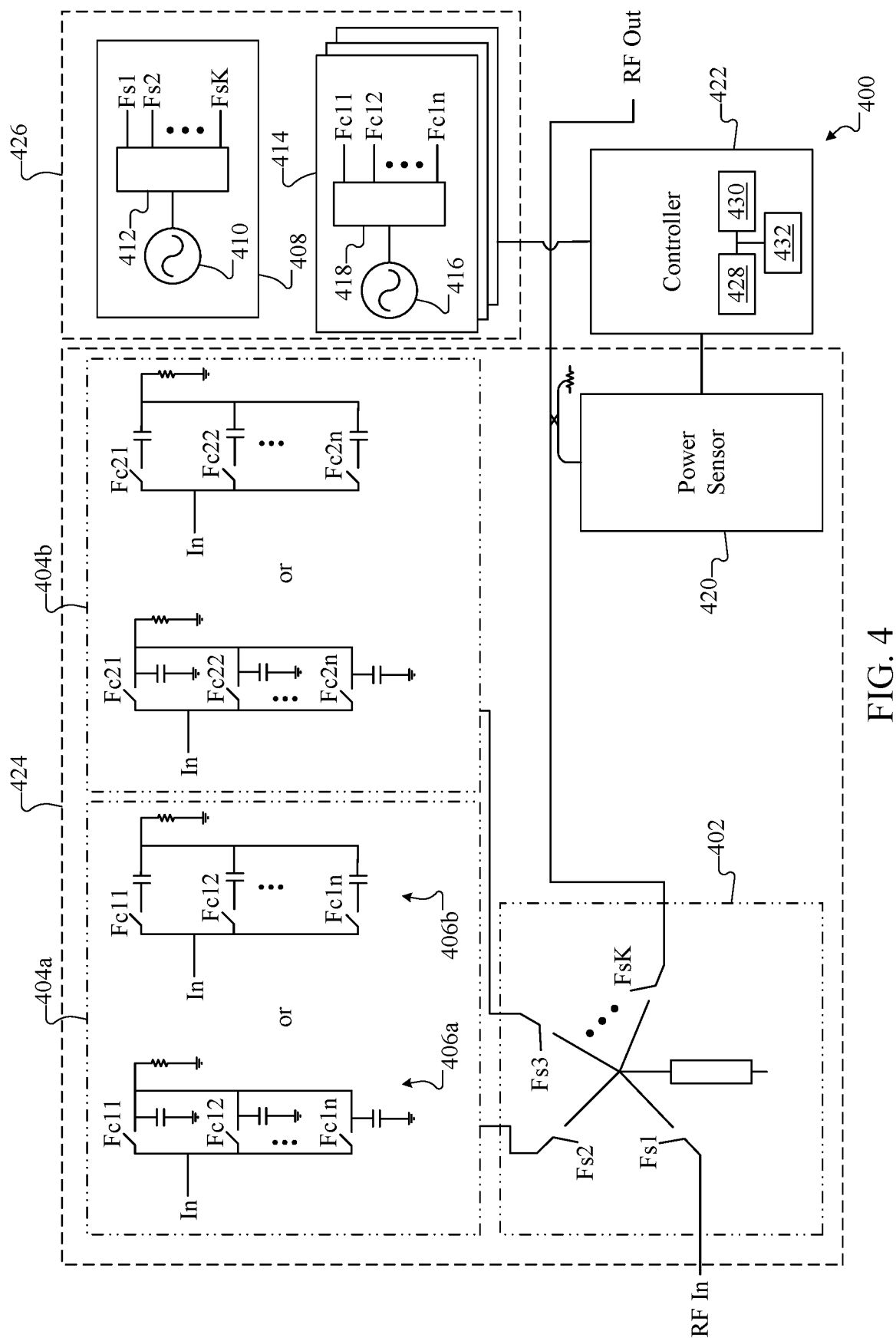
FIG. 4 illustrates an example architecture supporting a non-reciprocal circulator-based reconfigurable filtering system according to this disclosure.

FIG. 4 illustrates an example architecture 400 supporting a non-reciprocal circulator-based reconfigurable filtering system according to this disclosure. As shown in FIG. 4, the architecture 400 includes a non-reciprocal circulator 402, which may be the same as or similar to the non-reciprocal circulator 102 described above. The non-reciprocal circulator 402 here receives an RF input signal and provides an RF output signal. The non-reciprocal circulator 402 is also coupled to reflective filter elements 404a-404b, each of which includes an N-path reflective filter 406a or 406b (or possibly both, such as when each is controlled by an input switch). In the N-path reflective filter 406a, each of multiple paths includes a switch and a capacitor, where the capacitor has one end coupled to the switch and a load resistance and another end coupled to ground. In the N-path reflective filter 406b, each of multiple paths includes a switch and a capacitor, where the capacitor has one end coupled to the switch and another end coupled to a load resistance.

The switches in each N-path reflective filter 406a or 406b can be sequentially opened and closed using non-overlapping control signals Fc11-Fc1n, Fc21-Fc2n, etc. In the reflective filter element 404a, for example, an input signal to the N-path reflective filter 406a is totally absorbed at the switch control frequency Fc1, and the N-path reflective filter 406a functions as a reflective notch filter at the frequency Fc1. Similarly, an input signal to the N-path reflective filter 406b is totally reflected back at the switch control frequency Fc1, and the N-path reflective filter 406b functions as a reflective bandpass filter at the frequency Fc1.

In a clock source 408, an oscillator 410 operating at a desired frequency Fs can be used to generate a clock signal, and a clock divider 412 (such as a complementary metal oxide semiconductor (CMOS) clock divider) can be used to generate non-overlapping control signals for the non-reciprocal circulator 402. Similarly, in each of multiple clock sources 414, an oscillator 416 operating at a desired frequency Fc1, Fc2, etc. can be used to generate a clock signal, and a clock divider 418 (such as a CMOS clock divider) can be used to generate non-overlapping control signals for one of the reflective filter elements 404a-404b. In some cases, each reflective filter element 404a-404b may have its own associated clock source 414 that generates control signals for the N-path reflective filter 406a or 406b in that reflective filter element. In other cases, the reflective filter elements 404a-404b may share a common clock source 414 (with or without customized modification of the control signals from the common clock source 414).

In this example, a power sensor 420 can be used to sense the power of the RF output signal and provide measurements to a controller 422, such as a field programmable gate array or wideband synthesizer. The controller 422 can cause the frequency Fc1, Fc2, etc. of each clock source 414 to sweep over a desired frequency range, such as about 2 GHz to about 18 GHz or some other suitable frequency range. This may be used, for example, to help sense and combat blocker signals. The controller 422 can also or alternatively be used to control the generation of the sequential pulses in the control signals from the clock source 408 or the clock source 414. For instance, the controller 422 can determine which (one or more) of the reflective filter elements 404a-404b should be used to process the RF input signal, and the controller 422 may control the operation of the clock divider 412 to produce the desired sequential pulses for the switches of the non-reciprocal circulator 402. The controller 422 may also optionally determine the timing of the switches in the N-path filter(s) 406a or 406b to be used to process the RF input signal, and the controller 422 may control the operation of the clock divider 418 to produce the desired sequential pulses for the switches of the N-path filter(s) 404a or 406b.

In some embodiments, the various components shown within a dashed line 424 in FIG. 4 may be implemented using a GaN-based high-electron-mobility transistor (HEMT) device. Also, in some embodiments, the various components shown within a dashed line 426 in FIG. 4 may be implemented using a radio frequency silicon-on-insulator (RFSOI) CMOS FET-based device. Note, however, that the architecture 400 may be implemented in any other suitable manner using any other suitable number of devices.

The controller 422 includes any suitable structure configured to control operation of one or more components of the architecture 400, such as by controlling generation of control signals by the clock dividers 412, 418. For instance, the controller 422 may include one or more processing devices 428, such as one or more microprocessors, microcontrollers, digital signal processors, field programmable gate arrays, application specific integrated circuits, or discrete logic devices. The controller 422 may also include one or more memories 430, such as a random access memory, read only memory, hard drive, Flash memory, optical disc, or other suitable volatile or non-volatile storage device(s). The controller 422 may further include one or more interfaces 432 that support communications with other systems or devices (like the power sensor 420), such as a network interface card or a wireless transceiver facilitating communications over a wired or wireless network or a direct connection.

Although FIG. 4 illustrates one example of an architecture 400 supporting a non-reciprocal circulator-based reconfigurable filtering system, various changes may be made to FIG. 4. For example, any other suitable architecture may use one or more non-reciprocal circulator-based filters to perform one or more desired filtering functions. Also, various components in FIG. 4 may be combined, further subdivided, replicated, omitted, or rearranged and additional components may be added according to particular needs.

Figure 5:
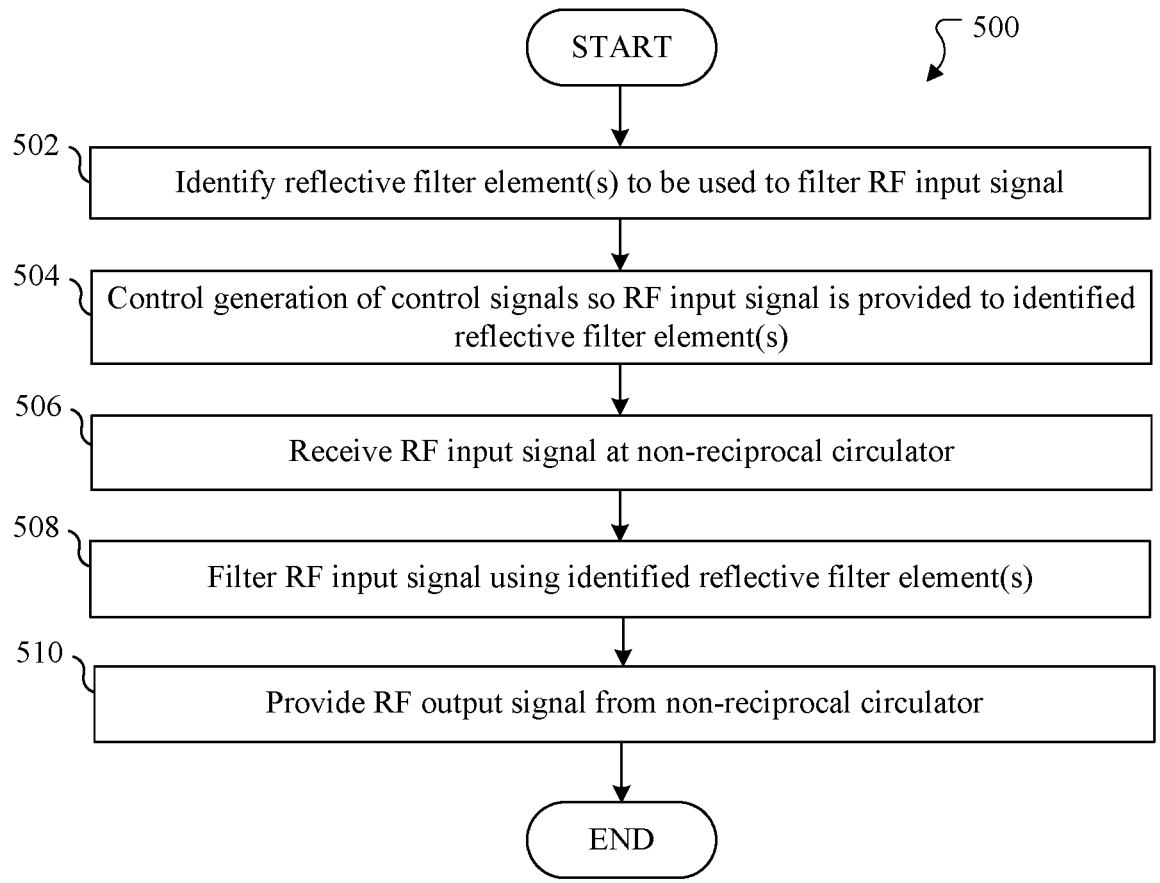
FIG. 5 illustrates an example method for wideband reconfigurable high-frequency filtering according to this disclosure.

FIG. 5 illustrates an example method 500 for wideband reconfigurable high-frequency filtering according to this disclosure. For ease of explanation, the method 500 is described as being performed using the circuit 100 or 200 of FIG. 1 or 2, which may be used in a larger system such as the architecture 400 of FIG. 4. However, the method 500 may be performed using any suitable device and in any suitable system.

As shown in FIG. 5, one or more reflective filter elements to be used to filter an RF input signal are identified at step 502. This may include, for example, the controller 422 or other component identifying one or more reflective filter elements 104a-104n to be used to filter an RF input signal 108. This may occur in various ways depending on the implementation. For instance, a sequence of reflective filter elements 104a-104n may be used in series during a sweep of a frequency range, or frequency responses of the reflective filter elements 104a-104n may be used to select one or more of the reflective filter elements 104a-104n that would provide a desired frequency response.

Generation of control signals is controlled so that the RF input signal will be provided to the one or more identified reflective filter elements at step 504. This may include, for example, the controller 422 or other component controlling the clock source 408 in order to generate sequential pulses in control signals provided to switches of at least one non-reciprocal circulator 102. The pulses in these control signals control whether the RF input signal 108 will pass through one, some, or all of the reflective filter elements 104a-104n (depending on the specific requirements).

The RF input signal is received at the non-reciprocal circulator at step 508 and filtered using the one or more identified reflective filter elements at step 510. This may include, for example, the non-reciprocal circulator 102 passing the RF input signal 108 to one of the reflective filter elements 104a-104n and receiving a filtered RF signal from that reflective filter element. This may also include the non-reciprocal circulator 102 passing the filtered RF signal to another of the reflective filter elements 104a-104n and receiving a twice-filtered RF signal from that reflective filter element. This may occur any number of times based on the number of identified reflective filter elements 104a-104n being used to filter the RF input signal 108. An RF output signal is provided from the non-reciprocal circulator at step 510. This may include, for example, the non-reciprocal circulator 102 outputting the RF output signal 110, which represents the RF input signal 108 as modified by at least one of the reflective filter elements 104a-104n.

Although FIG. 5 illustrates one example of a method 500 for wideband reconfigurable high-frequency filtering, various changes may be made to FIG. 5. For example, while shown as a series of steps, various steps in FIG. 5 may overlap, occur in parallel, occur in a different order, or occur any number of times. As a particular example, the reflective filter elements 104a-104n identified and used during filtering can change over time, such as during a frequency sweep.

It should be noted that while different circuits have been described above, a combination of features from the different circuits may be used together. For example, the clock source 408 may be used in either circuit 100 or 200 to generate control signals for the non-reciprocal circulator 102, and the controller 422 (with or without the power sensor 420) may be used in either circuit 100 or 200 to adjust control signals for the non-reciprocal circulator 102. Thus, any feature shown in one or more figures described above may be used in the circuit of another figure described above as needed or desired.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
   at least one non-reciprocal circulator; and
   multiple reflective filter elements, each reflective filter element configured to receive a radio frequency (RF) signal from the at least one non-reciprocal circulator and to provide a filtered RF signal to the at least one non-reciprocal circulator;
   wherein the reflective filter elements comprise amplitude change reflectors configured to modify amplitudes of the RF signal at different frequencies.

2. The system of claim 1, wherein the at least one non-reciprocal circulator and the amplitude change reflectors form a wideband reconfigurable filtering system.

3. The system of claim 1, wherein each of the amplitude change reflectors comprises a band-pass filter or a band-stop filter.

4. The system of claim 1, wherein:
   at least some of the amplitude change reflectors comprise band-pass filters; and
   at least some of the amplitude change reflectors comprise band-stop filters.

5. The system of claim 1, wherein each of the amplitude change reflectors comprises an N-path filter having multiple paths, each path comprising a switch and a capacitor.

6. The system of claim 5, wherein, in each path of the N-path filter, the capacitor has one end coupled to the switch and a load resistance and another end coupled to ground.

7. The system of claim 5, wherein, in each path of the N-path filter, the capacitor has one end coupled to the switch and another end coupled to a load resistance.

8. The system of claim 5, further comprising:
   a first oscillator and a first clock divider configured to generate control signals for switches of the at least one non-reciprocal circulator; and
   at least one second oscillator and at least one second clock divider configured to generate control signals for the switches of the N-path filters.

9. The system of claim 1, wherein:
   the reflective filter elements form multiple circuit branches;
   the at least one non-reciprocal circulator is configured to receive an RF input signal and provide an RF output signal, the RF output signal representing the RF input signal as modified by at least one of the reflective filter elements; and
   at least one of the circuit branches is configured to be selectively used to generate the RF output signal.

10. The system of claim 9, further comprising:
    an oscillator and a clock divider configured to generate control signals for switches of the at least one non-reciprocal circulator; and
    a controller configured to cause the clock divider to generate a sequence of pulses in the control signals in order to select one or more of the circuit branches used to generate the RF output signal.

11. A method comprising:
    receiving a radio frequency (RF) input signal using at least one non-reciprocal circulator; and
    generating an RF output signal using at least one of multiple reflective filter elements, each reflective filter element configured to receive an RF signal from the at least one non-reciprocal circulator and to provide a filtered RF signal to the at least one non-reciprocal circulator;
    wherein the reflective filter elements comprise amplitude change reflectors configured to modify amplitudes of the RF signal at different frequencies; and
    wherein the RF output signal represents the RF input signal as modified by the at least one of the reflective filter elements.

12. The method of claim 11, wherein the at least one non-reciprocal circulator and the amplitude change reflectors form a wideband reconfigurable filtering system.

13. The method of claim 11, wherein each of the amplitude change reflectors comprises a band-pass filter or a band-stop filter.

14. The method of claim 11, wherein:
    at least some of the amplitude change reflectors comprise band-pass filters; and
    at least some of the amplitude change reflectors comprise band-stop filters.

15. The method of claim 11, wherein each of the amplitude change reflectors comprises an N-path filter having multiple paths, each path comprising a switch and a capacitor.

16. The method of claim 15, further comprising:
    generating control signals having non-overlapping pulses for switches of the at least one non-reciprocal circulator; and
    for each of the N-path filters, generating control signals having non-overlapping pulses for the switches of the N-path filter.

17. The method of claim 11, further comprising:
    reconfiguring a system that includes the at least one non-reciprocal circulator and the reflective filter elements by changing a sequence of non-overlapping pulses in control signals provided to switches of the at least one non-reciprocal circulator and in control signals provided to switches of the reflective filter elements.

18. The method of claim 11, wherein:
    the reflective filter elements form multiple circuit branches; and
    one or more of the circuit branches are selectively used to generate the RF output signal.

19. The method of claim 18, further comprising:
    generating control signals for switches of the at least one non-reciprocal circulator; and
    producing a sequence of pulses in the control signals in order to select the one or more of the circuit branches used to generate the RF output signal.

20. A non-transitory computer readable medium containing instructions that when executed cause at least one controller to:
    reconfigure a system comprising at least one non-reciprocal circulator and multiple reflective filter elements, each reflective filter element configured to receive a radio frequency (RF) signal from the at least one non-reciprocal circulator and to provide a filtered RF signal to the at least one non-reciprocal circulator, wherein the reflective filter elements comprise amplitude change reflectors configured to modify amplitudes of the RF signal at different frequencies;
    wherein the instructions that cause the at least one controller to reconfigure the system comprise instructions that cause the at least one controller to change a sequence of non-overlapping pulses in control signals provided to multiple switches of each non-reciprocal circulator in order to selectively control which of the reflective filter elements is conductively coupled to the at least one non-reciprocal circulator.

\* \* \* \* \*